US012437976B2

(12) United States Patent
Shinada et al.

(10) Patent No.: US 12,437,976 B2
(45) Date of Patent: Oct. 7, 2025

(54) SUBSTRATE PROCESSING APPARATUS

(71) Applicant: Tokyo Electron Limited, Tokyo (JP)

(72) Inventors: Masato Shinada, Fuchu (JP); Einstein Noel Abarra, Fuchu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/945,649

(22) Filed: Nov. 13, 2024

(65) Prior Publication Data

US 2025/0174440 A1 May 29, 2025

(30) Foreign Application Priority Data

Nov. 24, 2023 (JP) ................................ 2023-199256

(51) Int. Cl.
*H01J 37/32* (2006.01)
*C23C 14/35* (2006.01)
*H01J 37/34* (2006.01)

(52) U.S. Cl.
CPC ........ *H01J 37/32651* (2013.01); *C23C 14/35* (2013.01); *H01J 37/32522* (2013.01); *H01J 37/3405* (2013.01); *H01J 2237/332* (2013.01)

(58) Field of Classification Search
None
See application file for complete search history.

(56) References Cited

U.S. PATENT DOCUMENTS

2005/0147742 A1* 7/2005 Kleshock .......... H01J 37/32522 428/685
2006/0156984 A1* 7/2006 Nozawa ............ H01J 37/32266 118/723 R
2007/0240979 A1* 10/2007 Nozawa .............. C23C 16/4404 204/298.01
2018/0265968 A1* 9/2018 Vetter ................... C23C 14/541
2024/0055235 A1* 2/2024 Matsumoto ....... H01J 37/32522

FOREIGN PATENT DOCUMENTS

JP 2022-518518 A 3/2022
JP 7057442 B2 4/2022

* cited by examiner

*Primary Examiner* — Jason Berman
(74) *Attorney, Agent, or Firm* — Armstrong Teasdale LLP

(57) ABSTRACT

A substrate processing apparatus includes: a processing container; a temperature adjustment structure including a flow path inside a sidewall of the processing container; a shield member installed in the processing container so as to be adjacent to the flow path; a conductive member installed between the shield member and the sidewall in which the flow path is located; a buffer member having conductivity and interposed between the shield member and the conductive member; and a plurality of fixing members installed between the sidewall and the conductive member, having elasticity and conductivity, and configured to fix the conductive member so that the conductive member is pressed against the shield member.

14 Claims, 5 Drawing Sheets

1

SUBSTRATE PROCESSING APPARATUS

CROSS-REFERENCE TO RELATED APPLICATION

This application is based upon and claims the benefit of priority from Japanese Patent Application No. 2023-199256, filed on Nov. 24, 2023, the entire contents of which are incorporated herein by reference.

TECHNICAL FIELD

The present disclosure relates to a substrate processing apparatus.

BACKGROUND

The Patent Document 1 discloses a vacuum processing apparatus capable of cooling a movable adhesion prevention plate provided in a vacuum chamber using a simple configuration. In the vacuum processing apparatus, an adhesion prevention plate is provided in the vacuum chamber. The adhesion prevention plate is composed of a fixed adhesion prevention plate fixedly disposed in the vacuum chamber and a movable adhesion prevention plate that is movable in one direction. The vacuum processing apparatus further includes a metal block body erected on an inner wall surface of the vacuum chamber and a cooling means configured to cool the block body. At a processing position of the movable adhesion prevention plate where a predetermined vacuum processing is performed on a substrate on which a film is to be formed, the top surface of the block body is placed close to or in contact with the movable adhesion prevention plate.

The Patent Document 2 discloses a shield cooling assembly including an adapter. The adapter is configured to fix a shield in a chamber. The adapter is provided with a cooling passage for feeding a coolant to cool the shield. The shield cooling assembly improves heat transfer efficiency and process quality.

PRIOR ART DOCUMENTS

Patent Documents

Patent Document 1: Japanese Patent No. 7057442
Patent Document 2: Japanese Patent Gazette Laid-open Publication No. 2022-518518

SUMMARY

According to one embodiment of the present disclosure, there is provided a substrate processing apparatus including: a processing container; a temperature adjustment structure including a flow path inside a sidewall of the processing container; a shield member installed in the processing container so as to be adjacent to the flow path; a conductive member installed between the shield member and the sidewall in which the flow path is located; a buffer member having conductivity and interposed between the shield member and the conductive member; and a plurality of fixing members installed between the sidewall and the conductive member, having elasticity and conductivity, and configured to fix the conductive member so that the conductive member is pressed against the shield member.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
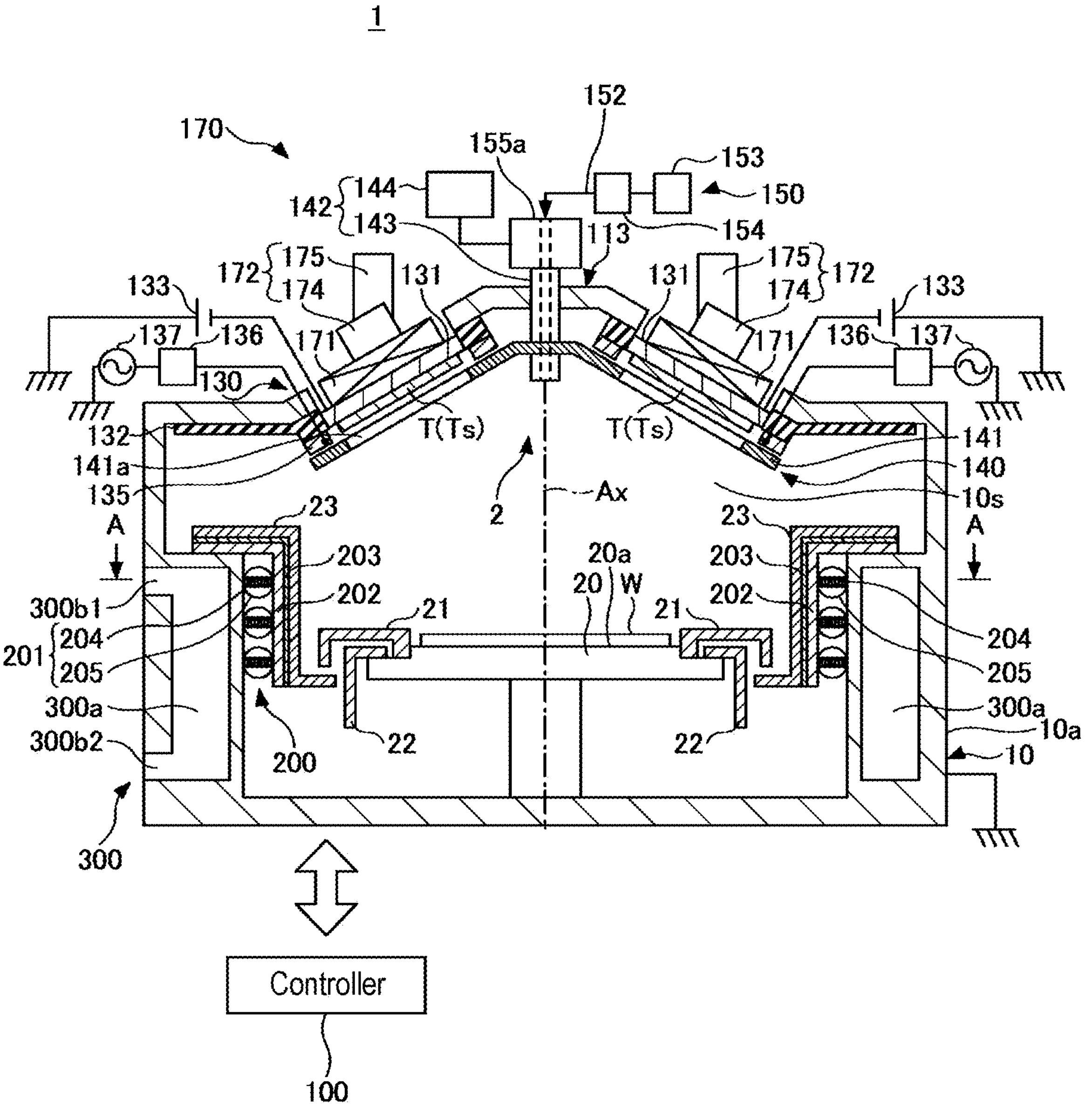
FIG. 1 is a schematic cross-sectional view showing an example of a substrate processing apparatus according to one embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, an embodiment of the present disclosure will be described with reference to the drawings. In the drawings, the same components are denoted by like reference numerals, and duplicated descriptions may be omitted.

[Substrate Processing Apparatus]

Figure 2:
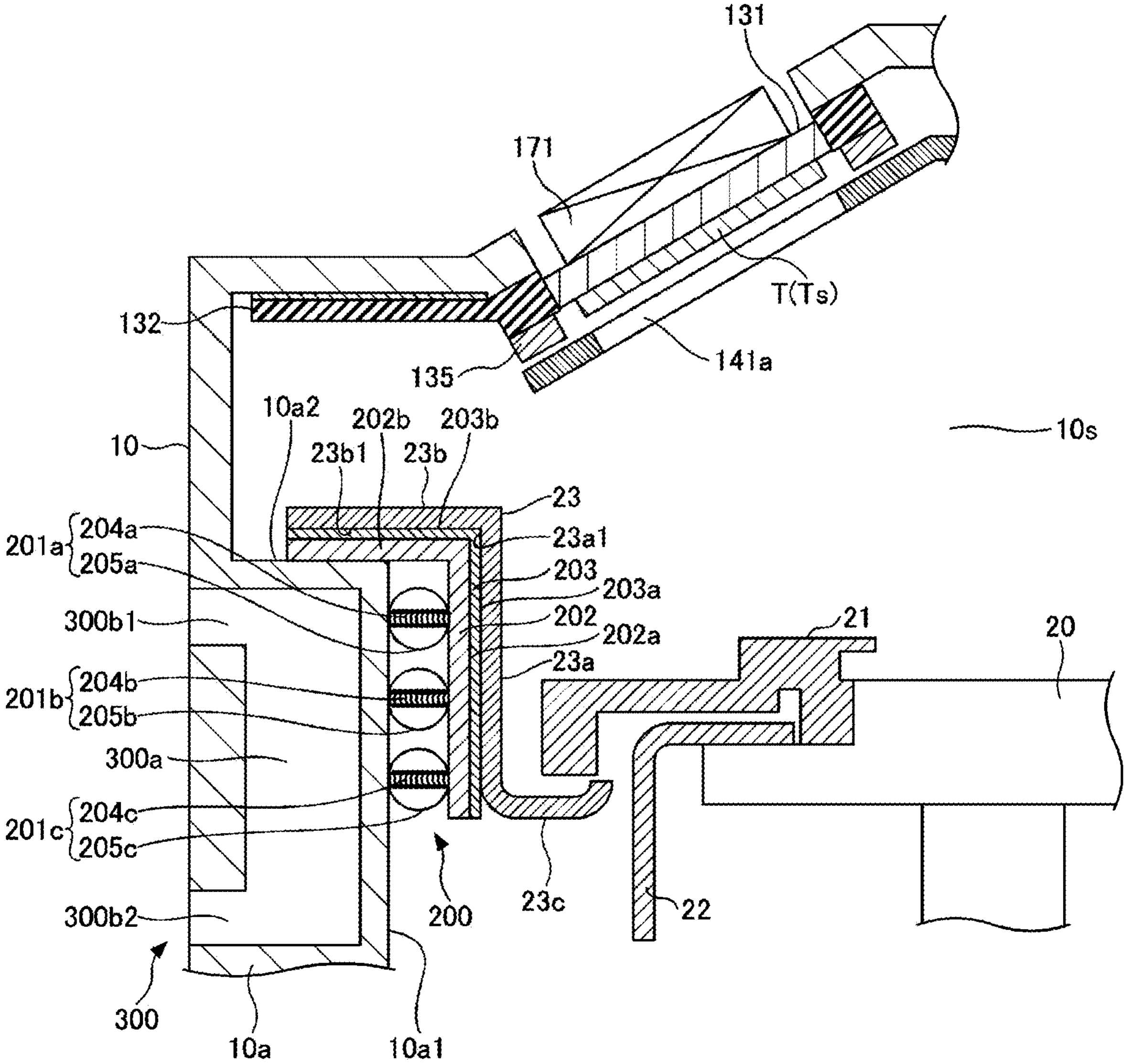
FIG. 2 is a schematic cross-sectional view showing an example of a structure around a shield member according to one embodiment.

A substrate processing apparatus 1 according to one embodiment will be described with reference to FIGS. 1 and 2. FIG. 1 is a schematic cross-sectional view showing an example of a substrate processing apparatus 1 according to one embodiment. FIG. 2 is a schematic cross-sectional view showing an example of a structure 200 around a shield member according to one embodiment.

The substrate processing apparatus 1 is a PVD (Physical Vapor Deposition) sputtering apparatus (film forming apparatus), and is a magnetron sputtering apparatus including a cathode part 2 as a sputtering source on a ceiling portion (lid) of a processing container 10.

The substrate processing apparatus 1 includes a processing container 10 and a stage 20. The stage 20 has a mounting surface 20*a* on which a substrate W such as a semiconductor wafer is mounted. The cathode part 2 is located above the stage 20 and configured to sputter a target T installed on the ceiling portion. Sputtered particles (film forming atoms) emitted from the target T adhere (deposit) on the surface of the substrate W mounted on the stage 20, thereby performing a film forming process on the substrate W. A processing space 10*s* is defined by a sidewall 10*a* of the processing container 10, the ceiling portion, and the stage 20.

The cathode part 2 is arranged on the ceiling portion and has a substantially conical shape (e.g., a substantially quadrangular conical shape, a conical shape, or the like). The central axis Ax is located at the center of the processing container 10 and is configured to pass through the top of the ceiling portion, extend in the vertical direction and pass through the center of the stage 20. The center of the mounting surface 20*a* of the stage 20 coincides with the central axis Ax. The stage 20 is supported on the bottom of the processing container 10 by a support. The stage 20 may be configured to be rotatable by a rotation device (not shown).

The processing container 10 is made of, for example, aluminum. The processing container 10 is connected to a ground potential. That is, the processing container 10 is grounded. The processing container 10 has a loading/unloading port that brings the processing space 10*s* into communication with the outside of the processing container 10, and a gate valve that opens and closes the loading/unloading port (both of which are not shown). When the gate valve is opened, the substrate processing apparatus 1 loads and unloads the substrate W through the loading/unloading port by a transfer device (not shown). In addition, an exhaust device (not shown) such as a vacuum pump evacuates the processing container 10 so that the processing space 10*s* is in a desired vacuum (reduced pressure) state.

The upper portion of the processing container 10 includes the cathode part 2 installed to face the stage 20 and configured to sputter targets T. The cathode part 2 has a target holder 130, a target cover 140, a gas supply 150, and a magnet mechanism 170. The target holder 130 holds the targets T, which are cathode targets, at a position spaced upward from the stage 20. The substrate processing apparatus 1 shown in FIG. 1 has two target holders 130. However, the number of targets T may be two or more, and may be, for example, four.

The target holding part 130 has metal holders 131 that hold the targets T, and an insulating member 132 that support the holders 131 by fixing outer peripheries of the holders 131.

The targets T held by the holders 131 are made of a material having a substance for film formation. Each of the targets T has a rectangular flat plate shape. The substrate processing apparatus 1 may also include targets T made of different types of materials. For example, a multilayer film can be formed in the processing container 10 by switching targets T made of different materials and performing sputtering. In other words, the substrate processing apparatus 1 may perform simultaneous sputtering (co-sputtering) in which multiple targets are simultaneously formed into films. The substrate processing apparatus 1 according to one embodiment forms a silicon (Si) film or the like on a substrate W as an example of a film forming process.

Each of the holders 131 is formed in a rectangular shape that is slightly larger than the target T in a plan view. Each of the holders 131 is fixed to the inclined surface of the ceiling portion via the insulating member 132. Since each of the holders 131 is fixed to the inclined surface of the ceiling portion, each of the holders 131 holds the surface of the target T (the sputtering surface exposed to the processing space 10*s*) in a state inclined with respect to the central axis Ax.

The power source connected to the cathode part 2 may be either a DC (direct current) power source or an RF (radio frequency) power source, or may be both a DC power source and an RF power source. However, the present disclosure is not limited thereto. When the power source connected to the cathode part 2 is only a DC power source, a DC magnet is used as a magnet 171 to perform sputtering. When the power sources connected to the cathode part 2 are a DC power source and an RF power source, a PCM (Point-Cusp-Magnetic Field) magnet is used as the magnet 171 to activate ionized particles and perform sputtering.

The target holding part 130 electrically connects DC power supplies 133 to the targets T held by the holders 131. Each of the DC power supplies 133 applies a negative DC voltage to the connected target T. The DC power supply 133 may be a single power supply that selectively applies a voltage to each of the targets T.

A metallic target shield (deposition prevention shield) 135 is installed to surround the target T held by the holder 131. The target shield 135 has an opening through which the target T is exposed, and is fixed to the inclined surface of a conical portion 113 via the insulating member 132. That is, the insulating member 132 is installed between the processing container 10, which is connected to the ground potential, and the target shield 135. As a result, the target shield 135 is not electrically connected to the processing container 10, and can be kept at a potential different from the ground potential. Furthermore, the target shield 135 and the holder 131 are not electrically connected to each other.

Further, an RF (Radio Frequency) power supply 137 is connected to the target shield 135 via an impedance matching device 136. One end of the RF power supply 137 is connected to a ground potential, and the other end of the RF power supply 137 is connected to the impedance matching device 136. The RF power supply 137 supplies weak RF power to the target shield 135 via the impedance matching device 136. In this regard, the RF power supplied by the RF power supply 137 has a frequency in the range of, for example, 400 kHz or more and 100 MHz or less, preferably 50 W or more and 10 kW or less.

The impedance matching device 136 is installed between the RF power supply 137 and the target shield 135. At this time, sputtered particles of a high-resistance material emitted from the target T adhere to the substrate W to form a film, and also adhere to the target shield 135 to form a high-resistance film on the surface of the target shield 135. The impedance matching device 136 performs impedance matching so that the electrical resistance of the target shield 135 and the high-resistance film formed on the target shield 135 is reduced (or becomes approximately zero) in an electric circuit in which a current (electrons) flows from plasma to a set potential.

The magnet mechanism 170 applies a magnetic field to each of the targets T. By applying a magnetic field to each of the targets T, the magnet mechanism 170 induces plasma in the targets T. For each of the holders 131, the magnet mechanism 170 has a magnet 171 (cathode magnet) and an operator 172 that operably holds the magnet 171. That is, the magnet 171 can be driven by the operator 172. In the example of FIG. 1, the magnet mechanism 170 has two magnets 171 and two operators 172 that hold the two magnets 171, respectively, which correspond to the two holders 131.

The magnets 171 are formed to have the same shape. Moreover, the magnets 171 generate a magnetic force of the same level. Specifically, each of the magnets 171 has a substantially rectangular shape in a plan view. In a state in which the operator 172 is held, the long side of the magnet 171 extends parallel to the transverse direction of the rectangular target T, while the short side of the magnet 171 extends parallel to the longitudinal direction of the rectangular target T.

Each of the magnets 171 may be a permanent magnet. The material constituting each of the magnets 171 is not particularly limited as long as it has an appropriate magnetic force, and may be, for example, iron, cobalt, nickel, samarium, and neodymium.

The operator 172 that holds each of the magnets 171 reciprocate the held magnet 171 along the longitudinal direction of the target T. That is, the magnets 171 are movably installed. Furthermore, the operator 172 that holds each of the magnets 171 move the held magnet 171 toward and away from the target T. Specifically, each of the operators 172 includes a reciprocating mechanism 174 that holds the magnet 171 and reciprocates the magnet 171, and a contact/separation mechanism 175 that holds the reciprocating mechanism 174 and moves the reciprocating mechanism 174 toward and away from the target T.

The target cover 140 includes a shield member 141 disposed in the processing container 10 and a support portion 142 that operably supports the shield member 141.

The shield member 141 is installed between the targets T and the stage 20. The shield member 141 is formed in a conical shape that is approximately parallel to the inclined surface of the ceiling portion of the processing container 10. The shield member 141 can face the sputtering surfaces of the multiple targets T. The shield member 141 also has an opening 141*a* corresponding to each of the targets T. The opening 141*a* is an opening slightly larger than each of the targets T, and is moved by the rotation of the shield member 141.

The opening 141*a* is disposed to face one target T (selected target Ts) among the multiple targets T by rotation of the support portion 142. By disposing the opening 141*a* to face the selected target Ts, the shield member 141 exposes only the selected target Ts to the substrate W on the stage 20. The shield member 141 prevents other targets T (non-selected targets) from being exposed.

The support portion 142 includes a columnar rotary shaft 143 and a rotator 144 that rotates the rotary shaft 143. The axis of the rotary shaft 143 overlaps with the central axis Ax of the processing container 10. The rotary shaft 143 extends along the vertical direction, and fixes the center (apex) of the shield member 141 at its lower end. The rotary shaft 143 penetrates the center of the ceiling portion and protrudes to the outside of the processing container 10.

The rotator 144 is installed outside the processing container 10, and rotates the rotary shaft 143 relative to an upper end connector 155*a* that holds the rotary shaft 143 via a rotation transmitting part (not shown). This causes the rotary shaft 143 and the shield member 141 to rotate around the central axis Ax. Therefore, the target cover 140 can adjust the circumferential position of the opening 141*a* to allow the opening 141*a* to face the selected target Ts to be sputtered.

In the substrate processing apparatus 1, the sputtering is performed by switching the targets using the target cover 140. However, the targets may be sputtered simultaneously without providing the target cover 140.

The gas supply 150 supplies an excitation gas from a connector 155*a* and a gas introducer that penetrates the rotary shaft 143. The gas supply 150 includes a pipe 152 that allows a gas to flow from outside the processing container 10. The gas supply 150 also includes a gas source 153, a flow rate controller 154, and the gas introducer, which are arranged in this order from the upstream side to the downstream side of the pipe 152.

The gas source 153 stores an excitation gas (e.g., an argon gas). The gas source 153 supplies the gas to the pipe 152. The flow rate controller 154 is, for example, a mass flow controller, and adjusts the flow rate of the gas supplied into the processing container 10. The gas introducer introduces the gas from the outside to the inside of the processing container 10.

The gas exhaust part (not shown) of the substrate processing apparatus 1 includes a pressure reducing pump and an adapter for fixing the pressure reducing pump to the bottom of the processing container 10. The gas exhaust part reduces the pressure in the processing space 10*s* of the processing container 10.

The controller 100 is made up of a computer and includes a CPU, an input device, an output device, a display device, a memory, etc. The CPU calls up a predetermined processing recipe stored in the memory or other storage medium, and causes the substrate processing apparatus 1 to execute a sputtering process based on the processing recipe.

[Shield Member in the Related Art]

With the substrate processing apparatus 1, in the process such as film formation or the like, a film adheres to the inside of the processing container 10 in addition to the substrate W. In the related art, in order to avoid contamination due to the adhered film, prevent particles from affecting the device characteristics on the substrate W and suppress generation of particles, an adhesion prevention plate called a shield member has been installed inside the processing container 10.

However, during the process, the heat from the plasma generated in the processing space 10*s* may cause the shield member to warp or become distorted due to thermal degradation, which may then cause the adhered film to peel off due to the stress characteristics (film stress) of the material of the shield member, resulting in a recurrence of contamination and particle generation.

Figure 3:
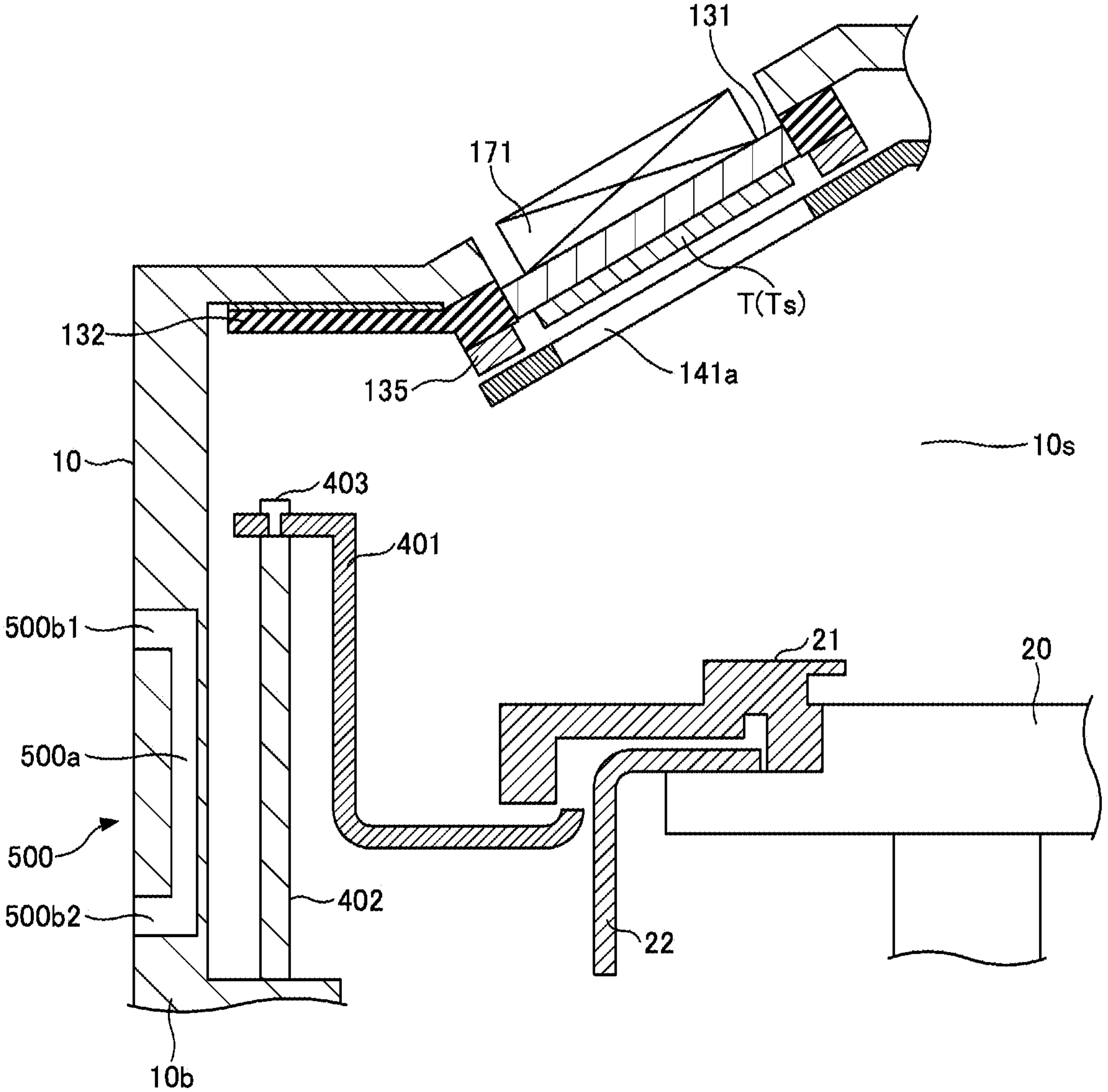
FIG. 3 (Related Art)
FIG. 3 is a schematic cross-sectional view showing an example of a structure around a shield member in the related art.

Therefore, in the related art, in order to avoid the thermal influence inside the processing container 10, a cooling structure such as a cooling flow path has been installed inside the wall of the processing container 10 or inside the stage 20. FIG. 3 is a schematic cross-sectional view showing an example of a cooling structure 500 in the related art.

For example, as shown in FIG. 3, a shield member 401 is installed on the outer periphery side of shield members 21 and 22 that protect the stage 20. The shield member 401 is installed between the sidewall 10*b* of the processing container 10 and the stage 20 so as to define a processing space 10*s* above the stage 20 and an exhaust space below the stage 20. The shield member 401 has a cylindrical side portion, an upper portion extending outward at the upper end of the side portion, and a lower portion extending inward at the lower end of the side portion. The upper portion of the shield member 401 is threadedly fixed to a metal shaft 402 extending vertically from the bottom of the processing container 10 by a screw 403, thereby fixing the shield member 401.

A cooling structure 500 is provided inside the sidewall 10*b*. The cooling structure 500 has a flow path 500*a* adjacent to the shield member 401. The flow path 500*a* has an inlet 500*b*1 and an outlet 500*b*2 connected to a chiller unit (not shown). The flow path 500*a* is formed in a ring shape around the entire circumference of the sidewall 10*b*. A temperature adjustment medium such as water or Galden, which is controlled to a predetermined temperature, flows into the flow path 500*a* from the inlet 500*b*1, flows through the flow path 500*a* around the entire circumference of the sidewall 10*b*, flows out from the outlet 500*b*2, and returns to the chiller unit. In this way, the cooling structure 500 dissipates heat from the shield member 401 through the shaft 402 using the temperature adjustment medium circulating through the flow path 500*a*, and suppresses the temperature rise of the shield member 401.

In this method, the shield member 401 is heated by the discharge and plasma generation during the process, and is cooled by plasma extinction after the process. This causes film peeling due to film stress caused by thermal expansion and contraction. In addition, there is concern that the film adhering to the screw 403 may peel off and affect maintainability because the screw 403 protrudes into the processing space 10*s* (discharge space).

On the other hand, there is a method in which the shield member is pre-heated before processing, thereby mitigating the temperature rise of the shield member even when heat is inputted from the plasma during the process, suppressing a change in the temperature of the shield member, and keeping the temperature as constant as possible.

However, depending on the film forming material, the film stress may increase, the film may be exposed to plasma, and the film adhering to the shield member may be peeled off. Depending on the properties of the film material, the amount of peeled film may increase, making it impossible to suppress particle generation.

Therefore, it is important to prevent the film from being peeled off during the process. Moreover, when fixing the shield member, it is important to prevent plasma from concentrating on protrusions and causing abnormal discharge due to the screw head being exposed in the processing space 10*s* (discharge space).

However, the method of increasing the number of temperature control structures is not realistic because it adds complex structures to the device, which increases processing and recycling costs and complicates the balance of the volume of the processing container 10 and the ease of maintenance.

[Shield Member of the Present Embodiment]

Therefore, as shown in FIGS. 1 and 2, the present embodiment proposes a structure within the processing container 10 that keeps a shield member 23 at a constant temperature during idling and during the process. In a cooling structure 300 according to the present embodiment, the temperature of the shield member 23 is maintained at the room temperature as far as possible during idling and during the process, and the temperature of the shield member 23 within the processing container 10 is stabilized.

In addition, in the present embodiment, it is not necessary to add any additional cooling structure. Therefore, the structure can be simplified, the processing and recycling costs can be reduced, and the maintainability can be improved. Furthermore, in the present embodiment, it is not necessary to provide protrusions such as screws for fixing the shield member to the cooling structure. Therefore, abnormal discharge can be prevented and particle generation can be suppressed.

Hereinafter, the cooling structure 300 and the structure 200 around the shield member 23 according to the present embodiment will be mainly described with reference to FIGS. 1 and 2. Three shield members 21, 22 and 23 are arranged between the stage 20 and the sidewall 10*a*. The shield members 21, 22 and 23 are made of, for example, aluminum. The shield member 21 is fixed to an upper surface of the outer periphery of the stage 20 to surround the periphery of the substrate on the stage 20. The shield member 22 is fixed to the upper surface of the outermost periphery of the stage 20 and is provided so as to cover the outermost periphery and a side surface of the stage 20. The shield member 22 is located below the shield member 21 and overlaps with the shield member 21 in a plan view. The shield members 21 and 22 are annular or cylindrical.

The shield members 21 and 22 protect the stage 20 and suppress the adhesion of a film to the upper surface and the side surface of the stage 20. The shield members 21 and 22 may be directly installed and fixed to the stage 20. Therefore, the temperature change is small and the film peeling is unlikely to occur. In contrast, the shield member 23 may not be directly installed in the processing container 10 because the screw heads are exposed to the processing space 10*s*, which may cause particles to be generated. Therefore, the substrate processing apparatus 1 has a cooling structure 300 and a structure 200 around the shield member 23 to suppress the generation of particles while increasing the cooling efficiency of the shield member 23.

The shield member 23 is disposed near the sidewall 10*a* of the processing container 10. The cooling structure 300 having a flow path 300*a* is provided inside the sidewall 10*a* of the processing container 10. The sidewall 10*a* has a protruding portion protruding from the bottom of the processing container 10 to approximately the center of the sidewall 10*a* around entire circumference of the sidewall 10*a*, and the protruding portion is thicker than the upper portion of the sidewall 10*a*. The cooling structure 300 includes the flow path 300*a* in the protruding portion of the sidewall 10*a* adjacent to the shield member 23. This increases the volume of the flow path 300*a* and increases the flow rate of the temperature adjustment medium flowing through the flow path 300*a*, thereby improving the cooling efficiency.

The flow path 300*a* has an inlet 300*b*1 and an outlet 300*b*2 connected to a chiller unit (not shown). The flow path 300*a* is formed in a ring shape around the entire circumference of the sidewall 10*a*. A temperature adjustment medium such as water or Galden, which is controlled to a predetermined temperature, flows into the flow path 300*a* from the inlet 300*b*1, flows through the flow path 300*a* around the entire circumference of the sidewall 10*a*, flows out from the outlet 300*b*2, and returns to the chiller unit. The cooling structure 300 has the flow path 300*a* inside the sidewall 10*a* of the processing container 10, and is an example of a temperature control structure that controls the temperature of the shield member 23. The temperature control referred to herein includes both cooling and heating.

As described above, in the cooling structure 300, the flow path 300*a* is positioned adjacent to the shield member 23. The flow path 300*a* is formed around the entire circumference of the shield member 23. The temperature adjustment medium is caused to flow through the flow path 300*a* at a relatively large flow rate. This makes it possible to improve the cooling efficiency of the shield member 23.

As shown in FIG. 1, the structure 200 around the shield member 23 includes a fixing member 201, a conductive member 202, and a buffer member 203. The fixing member 201 includes a first elastic member 204 and a second elastic member 205.

Referring to FIG. 2, the shield member 23 and the structure 200 therearound will be further described. The shield member 23 has a cylindrical side portion 23*a* and an upper portion 23*b* extending outward (toward the sidewall 10*a*) from the upper end of the side portion 23*a* over the entire circumference. The shield member 23 is configured so that a plurality of fixing members 201 are not exposed in the processing space 10*s*.

Furthermore, the shield member 23 has a lower portion 23*c* that extends inward (toward the stage 20) from the lower end of the side portion 23*a* over the entire circumference. As a result, the shield member 23 is installed so as to define the processing space 10*s* between the sidewall 10*a* and the stage 20 and define the exhaust space below the stage 20. That is, the shield member 23 is a cylindrical member having a substantially S-shaped cross section in the circumferential direction. The shield member 23 may not have the lower portion 23*c*. In this case, the shield member 23 is formed as a cylindrical member having a substantially L-shaped cross section in the circumferential direction.

The conductive member 202 is installed between the shield member 23 and the sidewall 10*a* where the flow path 300*a* is located. The conductive member 202 is a plate made of copper. However, the conductive member 202 is not limited to copper, and may be made of any metal such as gold or aluminum as long as the material has good thermal conductivity.

The conductive member 202 has a cylindrical side portion 202*a* and an upper portion 202*b* extending outward (toward the sidewall 10*a*) from the upper end of the side portion 202*a* over the entire circumference. That is, the conductive member 202 is a cylindrical member having a substantially L-shaped cross section in the circumferential direction. The side portion 202*a* faces a side surface 10*al* on which the flow path 300*a* of the sidewall 10*a* is located. The upper portion 202*b* is disposed so as to contact the upper surface 10*a*2 of the sidewall 10*a* at the tip end side of the upper portion 202*b*.

The buffer member 203 is sandwiched between the shield member 23 and the conductive member 202. The buffer member 203 is conductive and is made of a material that is softer than the shield member 23 and the conductive member 202. The buffer member 203 is a sheet-like member made of, for example, carbon. However, the material of the buffer member 203 is not limited to carbon, and any metal such as indium may be used as the buffer member 203 as long as it is softer than the conductive member 202. Whether the buffer member 203 is made of a material softer than the conductive member 202 can be determined based on the Young's modulus of each constituent material, or the like.

The buffer member 203 has a cylindrical side portion 203*a* and an upper portion 203*b* extending from the upper end of the side portion 203*a* to the outside (sidewall 10*a* side) over the entire circumference. That is, the buffer member 203 is a cylindrical member having a substantially L-shaped cross section in the circumferential direction. The side portion 203*a* faces the side surface 10*al* on which the flow path 300*a* of the sidewall 10*a* is located via the side portion 202*a* of the conductive member 202. The tip end side of the upper portion 203*b* is disposed on the upper surface 10*a*2 of the sidewall 10*a* via the upper portion 202*b* of the conductive member 202. As a result, the upper portion of the shield member 23 contacts the upper surface 10*a*2 of the sidewall 10*a* via the conductive member 202 and the buffer member 203, and is grounded.

The conductive member 202 covers the outer surface 23*al* of the side portion 23*a* of the shield member 23 and the entire lower surface 23*b*1 of the upper portion 23*b*, and the buffer member 203 is interposed between the conductive member 202 and the shield member 23. If the shield member 23 and the conductive member 202 are in direct contact with each other, friction between metals may generate metal particles. In addition, the thermal conductivity may decrease due to the difference in surface roughness between the shield member 23 and the conductive member 202. In contrast, by interposing the buffer member 203, which is softer than the shield member 23 and the conductive member 202, between the shield member 23 and the conductive member 202, it is possible to suppress the generation of metal particles due to friction. In addition, it is possible to increase the adhesion between the shield member 23 and the conductive member 202 and increase the thermal conductivity. This allows efficient heat transfer from the conductive member 202 to the shield member 23, and the shield member 23 can be stably maintained at a constant temperature.

A plurality of fixing members 201 is provided between the sidewall 10*a* and the conductive member 202. The fixing members 201 are elastic and conductive, and fix the conductive member 202 to be pressed against the shield member 23.

In the present embodiment, three fixing members 201 are installed one above another in the vertical direction. That is, the three fixing members 201 form a set of fixing portions including an upper fixing portion 201*a*, a lower fixing portion 201*c* located below the upper fixing portion 201*a*, and an intermediate fixing portion 201*b* located between the upper fixing portion 201*a* and the lower fixing portion 201*c*, which are installed at positions overlapping in a plan view.

Figure 4:
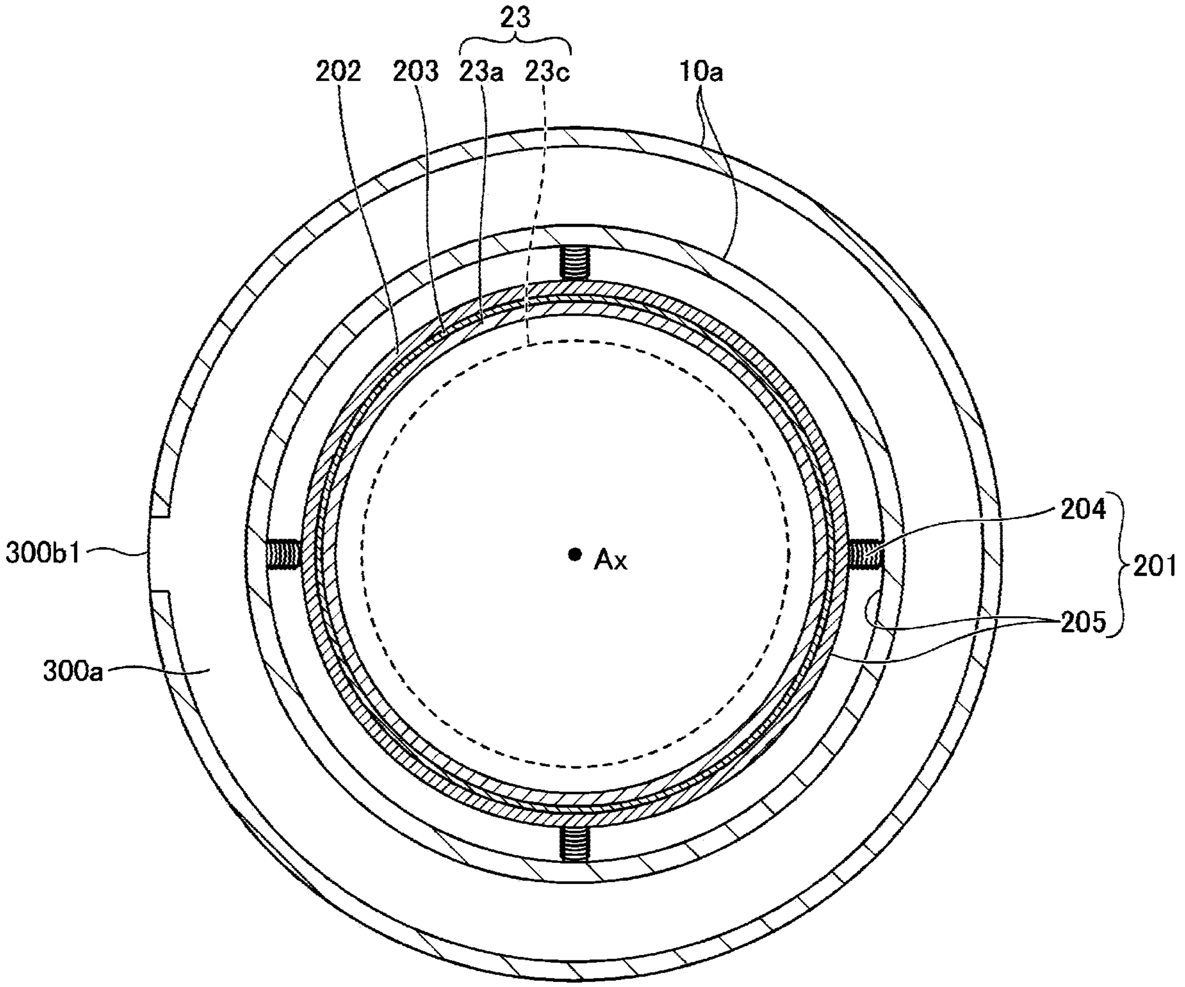
FIG. 4 is a cross-sectional view taken along line A-A in FIG. 1.

FIG. 4 is a diagram showing a cross section taken along line A-A in FIG. 1. The flow path 300*a* is provided around the entire circumference inside the sidewall 10*a*. In addition, the shield member 23 is installed around the entire circumference near the flow path 300*a* via the conductive member 202 and the buffer member 203.

Referring to FIG. 4, the fixing members 201 are composed of four sets of fixing portions, and the four sets of fixing portions are arranged in the circumferential direction along the sidewall 10*a*. However, the number of sets of fixing portions is not limited to four, and may be any number as long as it is multiple sets. It is preferable that the fixing portions are arranged evenly in the circumferential direction in order to increase thermal conduction and reduce a change in temperature of the shield member 23.

The upper fixing portions 201*a*, the intermediate fixing portion 201*bs*, and the lower fixing portions 201*c* in FIG. 2) as the fixing portions respectively have a plurality of first elastic members 204 (204*a*, 204*b* and 204*c*) arranged in a radial direction toward the central axis Ax of the processing container 10 and a hollow second elastic member 205 (205*a*, 205*b* and 205*c*) formed so as to accommodate the plurality of first elastic members 204 in the second elastic member 205. The first elastic member 204 is formed of a metal such as aluminum, stainless steel, or Inconel. The second elastic member 205 is not limited to copper, and may be a metal such as gold or aluminum as long as it is a material with good thermal conductivity. If the second elastic member 205 is made of the same material as the conductive member 202, it has good thermal conductivity.

The first elastic members 204*a*, 204*b* and 204*c* are metal springs formed in a spiral shape. However, the first elastic members 204*a*, 204*b* and 204*c* are not limited to such springs and may be elastic members such as leaf springs as long as they are configured to generate a pressing force for pressing the conductive member 202 against the shield member 23. The second elastic members 205*a*, 205*b* and 205*c* are formed by rolling a thin sheet of, for example, about 0.2 mm to 0.5 mm into a circular cross section and connecting both ends thereof to form a hollow annular member.

The second elastic member 205*a* accommodates four first elastic members 204*a* therein. The four first elastic members 204*a* are arranged at equal intervals in the circumferential direction inside the annular second elastic member 205*a*. The second elastic member 205*b* accommodates four first elastic members 204*b* therein. The four first elastic members 204*b* are arranged at equal intervals in the circumferential direction inside the annular second elastic member 205*b*. The second elastic member 205*c* accommodates four first elastic members 204*c* therein. The four first elastic members 204*c* are arranged at equal intervals in the circumferential direction inside the annular second elastic member 205*c*.

Each of the second elastic members 205*a*, 205*b* and 205*c* is installed between the sidewall 10*a* and the conductive member 202 so as to be in contact with the sidewall 10*a* and the conductive member 202 over the entire circumference. This makes it possible to ensure high thermal conductivity between the sidewall 10*a* and the conductive member 202.

By pressing the conductive member 202 against the shield member 23 with the elastic force of the first elastic member 204 in this manner, the shield member 23 is fixed without having to use screws. Therefore, screws are unnecessary, and protrusions such as screws are not exposed in the processing space 10*s*. This makes it possible to reduce particle sources.

Furthermore, the cooling structure 300 has the flow path 300*a* disposed in the vicinity of the shield member 23. By allowing a temperature adjustment medium to flow through the flow path 300*a*, the temperature of the shield member 23 can be adjusted (the shield member 23 can be cooled or heated) via the fixing members 201, the buffer members 203, and the conductive members 202.

The fixing members 201, the buffer member 203, and the conductive member 202 are made of a metal with high thermal conductivity. The elastic force of the fixing members 201 presses the conductive members 202 against the shield member 23. This further improves the thermal conductivity and increases the heat dissipation efficiency of the shield member 23. The conductive members 202 alone may not be enough to cool the shield member 23 by the cooling action of the cooling structure 300. Therefore, the buffer members 203 such as carbon sheets with good thermal conductivity are installed between the conductive members 202 and the shield member 23. With the above structure, all of the shield member 23 and the conductive member 202 are constantly cooled, thereby preventing the temperature rise of the conductive members 202 and stably adjusting the temperature of the shield member 23 to a constant temperature.

In the processing space 10*s*, during a process, plasma is generated from the gas supplied into the processing container 10 by the RF power supplied from the RF power supply 137. In contrast, the second elastic member 205 is in close contact with the sidewall 10*a* over the entire circumference. Therefore, the second elastic member 205 can dissipate heat from the plasma to the outside more efficiently than the first elastic member 204 such as a spring. The second elastic member 205 also accommodates the first elastic member 204. This can prevent the first elastic member 204 from being exposed to the plasma.

The first elastic member 204 may penetrate the second elastic member 205, with one end screwed into a hole provided in the sidewall 10*a* and the other end screwed into a hole provided in the conductive member 202. Even in this case, the first elastic member 204 and the second elastic member 205 are covered by the shield member 23, and no protrusions such as screw heads are exposed in the processing space 10*s*. By avoiding such a protruding structure, it is possible to suppress the generation of particles.

As described above, according to the substrate processing apparatus 1 of the present embodiment, it is possible to stabilize the temperature of the shield member 23 in the processing container 10. In addition, it is possible to reduce costs by simplifying the structure 200 around the shield member 23 and simplifying the maintenance parts.

[Modification]

Figure 5:
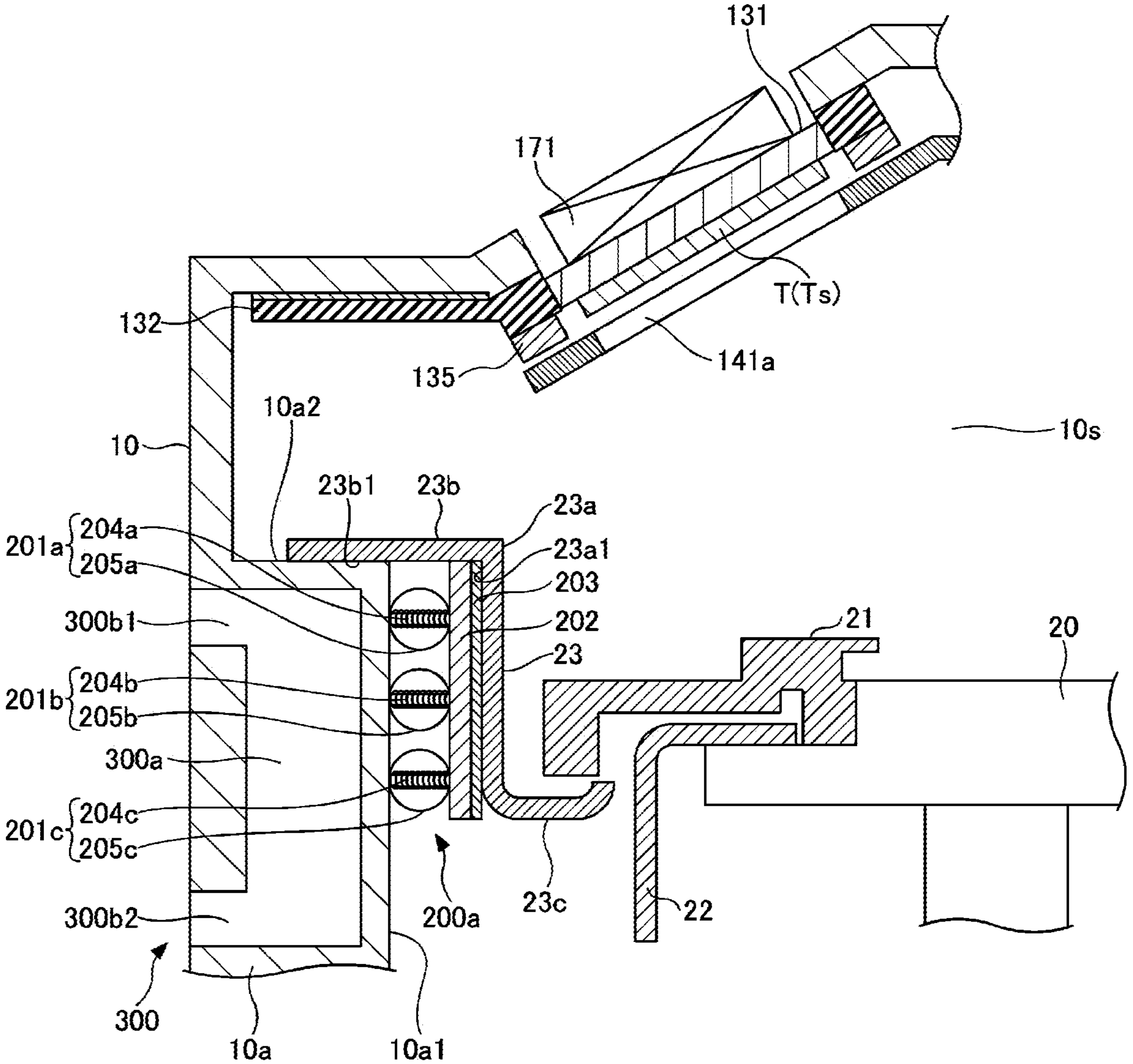
FIG. 5 is a schematic cross-sectional view showing an example of a structure around a shield member according to a modification.

A structure 200*a* around a shield member 23 according to a modification will be described with reference to FIG. 5. FIG. 5 is a schematic cross-sectional view showing an example of the structure 200*a* around the shield member 23 according to a modification.

In the structure 200*a* around the shield member 23 according to the modification, the conductive member 202 has only a cylindrical side portion and does not have an upper portion. Furthermore, the buffer member 203 has only a cylindrical side portion and does not have an upper portion. Other configurations of the substrate processing apparatus 1 are the same as those of the substrate processing apparatus 1 according to the above-described embodiment.

The conductive member 202 covers the entire periphery of the outer surface 23*al* of the side portion 23*a* of the shield member 23, and the buffer member 203 is interposed between the conductive member 202 and the shield member 23.

Therefore, in the substrate processing apparatus of the modification, the upper portion 23*b* of the shield member 23 contacts the upper surface 10*a*2 of the sidewall 10*a* on which the flow path 300*a* is located, without the conductive member 202 and the buffer member 203 being interposed therebetween.

The upper portion 23*b* of the shield member 23 may be located above the upper surface 10*a*2 of the sidewall 10*a* without contacting the upper surface 10*a*2. In other words, the lower surface 23*b*1 of the upper portion 23*b* of the shield member 23 may or may not contact the upper surface 10*a*2 of the sidewall 10*a*.

As described above, according to the substrate processing apparatus of this modification, the structure 200*a* around the shield member 23 can stabilize the temperature of the shield member 23 in the processing container 10. Furthermore, the simplification of the structure 200*a* around the shield member 23 and the simplification of maintenance parts can reduce costs.

[Others]

The substrate processing apparatus 1 is not limited to the sputtering apparatus shown in FIG. 1 and the like, but may also be an ALD (Atomic Layer Deposition) apparatus or a CVD (Chemical Layer Deposition) apparatus. The substrate processing apparatus 1 may be applied to any of a capacitively coupled plasma processing apparatus, an inductively coupled plasma processing apparatus, a microwave plasma processing apparatus, a VHF wave plasma processing apparatus, and a UHF wave plasma processing apparatus.

In the above-described embodiment, the substrate processing apparatus 1 is described as a single-substrate type substrate processing apparatus that processes substrates W one by one. However, the present disclosure is not limited thereto. For example, the substrate processing apparatus may be a batch type substrate processing apparatus that processes multiple substrates W at once. For example, the substrate processing apparatus may be a semi-batch type substrate processing apparatus that processes substrates W by revolving the substrates W arranged on a turntable in a processing container and allowing the substrates W to sequentially pass through an area where a first gas is supplied and an area where a second gas is supplied. For example, the substrate processing apparatus may be a multi-substrate film forming apparatus having multiple mounting tables in one processing container.

The processing of the substrate W performed by the substrate processing apparatus 1 includes, for example, a film forming process, an etching process, and the like.

The substrate processing apparatus according to the embodiment disclosed herein should be considered as exemplary and not limitative in all respects. The embodiment may be modified and improved in various ways without departing from the scope and spirit of the appended claims. The matters described in the above embodiment may be configured in other ways without any contradiction, and may be combined without any contradiction.

According to the present disclosure in some embodiments, it is possible to stabilize the temperature of the shield member in the processing container.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:

a processing container;

a temperature adjustment structure including a flow path inside a sidewall of the processing container;

a shield member installed in the processing container so as to be adjacent to the flow path;

a conductive member installed between the shield member and the sidewall in which the flow path is located;

a buffer member having conductivity and interposed between the shield member and the conductive member; and a plurality of fixing members installed between the sidewall and the conductive member, having elasticity and conductivity, and configured to fix the conductive member so that the conductive member is pressed against the shield member.

2. The substrate processing apparatus of claim 1, wherein the temperature adjustment structure is configured to adjust a temperature of the shield member via the plurality of fixing members, the buffer member, and the conductive member by allowing a temperature adjustment medium to flow through the flow path.

3. The substrate processing apparatus of claim 2, wherein the shield member includes a cylindrical side portion between the sidewall and a processing space in which plasma is generated from a gas supplied into the processing container by RF power, and an upper portion extending outward from an upper end of the side portion over an entire circumference of the shield member, and wherein the shield member is configured so that the plurality of fixing members is not exposed to the processing space.

4. The substrate processing apparatus of claim 3, wherein the conductive member covers an outer surface of the side portion and an outer surface of the upper portion of the shield member over the entire circumference, and wherein the buffer member is interposed between the conductive member and the shield member.

5. The substrate processing apparatus of claim 4, wherein the upper portion of the shield member contacts an upper surface of the sidewall in which the flow path is located, via the conductive member and the buffer member.

6. The substrate processing apparatus of claim 3, wherein the conductive member covers an outer surface of the side portion of the shield member, and wherein the buffer member is interposed between the conductive member and the shield member.

7. The substrate processing apparatus of claim 6, wherein the upper portion of the shield member is in contact with or in non-contact with an upper surface of the sidewall in which the flow path is located, and wherein the conductive member and the buffer member are not interposed between the upper surface of the sidewall and the shield member.

8. The substrate processing apparatus of claim 1, wherein the flow path is formed around an entire circumference of the shield member, and wherein the shield member has a cylindrical shape.

9. The substrate processing apparatus of claim 1, wherein the shield member includes a cylindrical side portion between the sidewall and a processing space in which plasma is generated from a gas supplied into the processing container by RF power, and an upper portion extending outward from an upper end of the side portion over an entire circumference of the shield member, and wherein the shield member is configured so that the plurality of fixing members is not exposed to the processing space.

10. The substrate processing apparatus of claim 1, wherein the plurality of fixing members includes a plurality of sets of fixing portions, with each set of fixing portions including an upper fixing portion, a lower fixing portion located below the upper fixing portion, and an intermediate fixing portion located between the upper fixing portion and the lower fixing portion, which are installed at positions overlapping in a plan view, and wherein the plurality of sets of fixing portions is arranged in a circumferential direction along the sidewall.

11. The substrate processing apparatus of claim 10, wherein the upper fixing portions, the intermediate fixing portions, and the lower fixing portions respectively have a plurality of first elastic members arranged radially toward a central axis of the processing container, and a hollow second elastic member configured to accommodate the plurality of first elastic members in the second elastic member.

12. The substrate processing apparatus of claim 11, wherein the first elastic member is a spring.

13. The substrate processing apparatus of claim 11, wherein the second elastic member is a hollow annular member.

14. The substrate processing apparatus of claim 1, which is one of a capacitively coupled plasma processing apparatus, an inductively coupled plasma processing apparatus, a microwave plasma processing apparatus, a VHF plasma processing apparatus, and a UHF plasma processing apparatus, and is one of a single-substrate processing apparatus configured to process substrates one by one, a batch processing apparatus configured to process multiple substrates at once, and a semi-batch processing apparatus.

* * * * *